United States Patent
Zhang

(10) Patent No.: US 7,449,969 B2
(45) Date of Patent: Nov. 11, 2008

(54) PRINTED CIRCUIT BOARD

(75) Inventor: Hai-Yun Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 136 days.

(21) Appl. No.: 11/309,629

(22) Filed: Sep. 1, 2006

(65) Prior Publication Data

US 2007/0103246 A1    May 10, 2007

(30) Foreign Application Priority Data

Nov. 4, 2005    (CN) ............................ 200510101029

(51) Int. Cl.
*H03B 5/32* (2006.01)
*H03B 5/36* (2006.01)
*H03L 1/00* (2006.01)

(52) U.S. Cl. .................... 331/158; 331/108 D; 331/175

(58) Field of Classification Search ............. 331/108 D, 331/116 R, 116 FE, 158, 159, 175, 187
See application file for complete search history.

(56) References Cited

U.S. PATENT DOCUMENTS 6,459,045 B1    10/2002    Chang et al.
2006/0261451 A1 *  11/2006    Nakatsu et al. ............. 257/673

* cited by examiner

*Primary Examiner*—David Mis
(74) *Attorney, Agent, or Firm*—Wei Te Chung

(57) ABSTRACT

A printed circuit board (PCB) includes a signal layer and a power layer. The signal layer includes a crystal oscillator pad, a clock generator pad, and two capacitor pads. The crystal oscillator pad is connected to the clock generator pad and the capacitor pads via two signal lines. The power layer is divided into two areas by a cut-off line, the two areas respectively having different voltages. The cut-off line is located at one side of the crystal oscillator pad and the clock generator pad.

15 Claims, 4 Drawing Sheets

PRINTED CIRCUIT BOARD

DESCRIPTION

1. Field of the Invention

The present invention relates to printed circuit boards (PCBs), and particularly to a PCB with crystal oscillator having great frequency stability.

2. Description of Related Art

Generally speaking, a crystal oscillator is an electronic circuit that creates an electrical signal with a very precise frequency. This frequency is used to keep track of time, to stabilize frequencies for radio transmitters, and to provide a stable clock signal for PCBs.

FIG. 1 shows a signal layer 4 of a conventional PCB. The signal layer 4 includes a crystal oscillator pad 41, a clock generator pad 42, and two capacitor pads 44, 45. The crystal oscillator pad 41 defines two vias 411, 412 therein for connecting a crystal oscillator (not shown). The clock generator pad 42 includes two rows of small pads. The via 411 is connected to the capacitor pad 44 and the clock generator pad 42 by a signal line 46. The via 412 is connected to the capacitor pad 45 and the clock generator pad 42 by a signal line 47. The widths of the signal lines 46 and 47 are approximately five mils. The PCB includes a power layer under the signal layer 4, and the power layer is divided into two areas by a cut-off line 51, the two areas respectively having different voltages. A part of the cut-off line 51 is located under the crystal oscillator pad 41, so the two different voltages in the power layer may interfere with the crystal oscillator, thereby the frequency of the crystal oscillator may be unstable and disturb the clock frequency of the PCB.

What is desired, therefore, is to provide a PCB increased frequency stability of a crystal oscillator thereof.

SUMMARY OF THE INVENTION

In one preferred embodiment, a printed circuit board (PCB) includes a signal layer and a power layer. The signal layer includes a crystal oscillator pad, a clock generator pad, and two capacitor pads. The crystal oscillator pad is connected to the clock generator pad and the capacitor pads via two signal lines. The power layer is divided into two areas by a cut-off line, the two areas respectively having different voltages. The cut-off line is located at one side of the crystal oscillator pad and the clock generator pad.

Other advantages and novel features will become more apparent from the following detailed description when taken in conjunction with the accompanying drawings, in which:

DETAILED DESCRIPTION OF THE INVENTION

Figure 1:
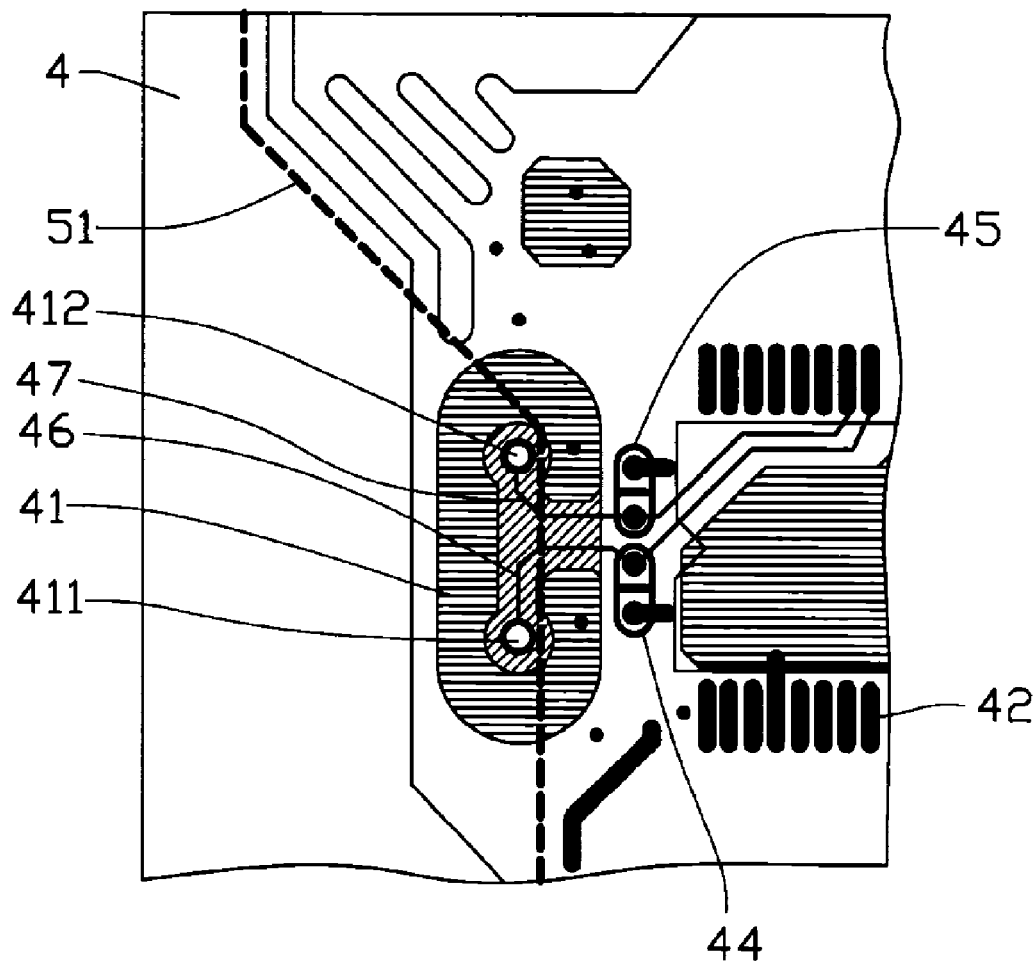
FIG. 1 is a plane view of a signal layer of a conventional PCB, with a broken line indicating a cut-off line of a power layer of the PCB.
Figure 2:
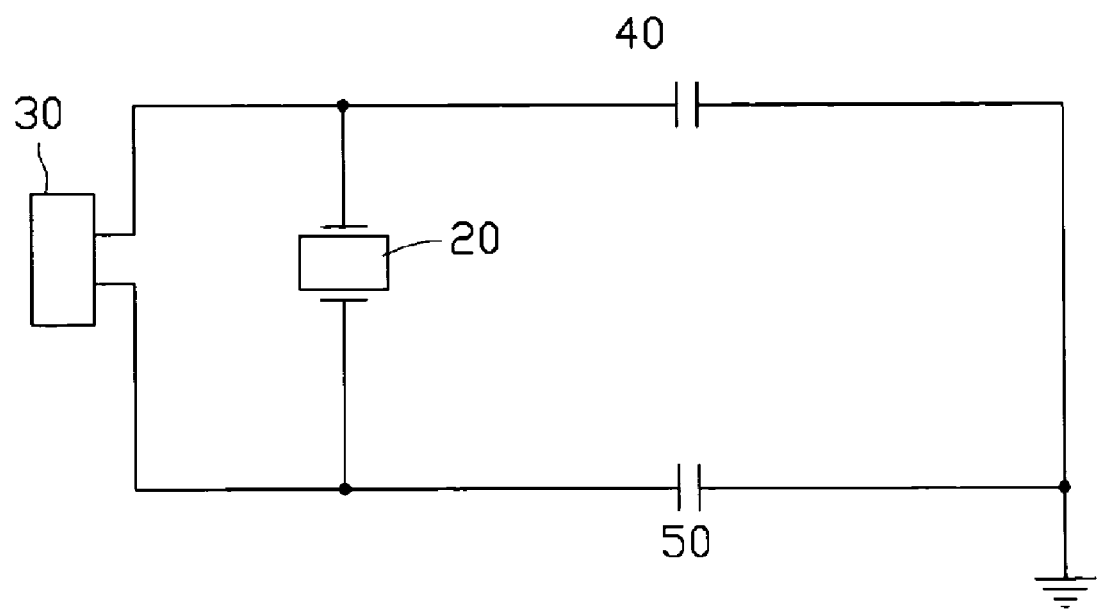
FIG. 2 is a circuit diagram of a crystal oscillator of a PCB in accordance with a preferred embodiment of the present invention.

Referring to FIG. 2, a crystal oscillator circuit of a printed circuit board (PCB) in accordance with a preferred embodiment of the present invention is shown. The crystal oscillator circuit includes a crystal oscillator 20, a clock generator chip 30, and two filter capacitors 40, 50. The crystal oscillator 20 is connected to the clock generator chip 30, and two ends of the crystal oscillator 20 are respectively grounded via corresponding filter capacitors 40 and 50. The crystal oscillator 20 continuously generates a high-frequency pulse signal, and inputs the signal to the clock generator chip 30. After the signal is adjusted in the clock generator chip 30, the adjusted signal is transmitted to the other parts of the PCB where a control frequency is needed.

Figure 3:
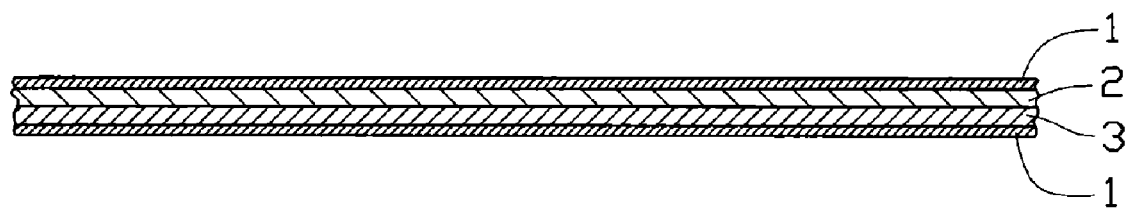
FIG. 3 is a cross-sectional view of the PCB of FIG. 2.

Referring also to FIG. 3, the PCB includes a pair of signal layers 1, a power layer 2, and a ground layer 3, the power layer 2 and the ground layer 3 are located between the signal layers 1.

Figure 4:
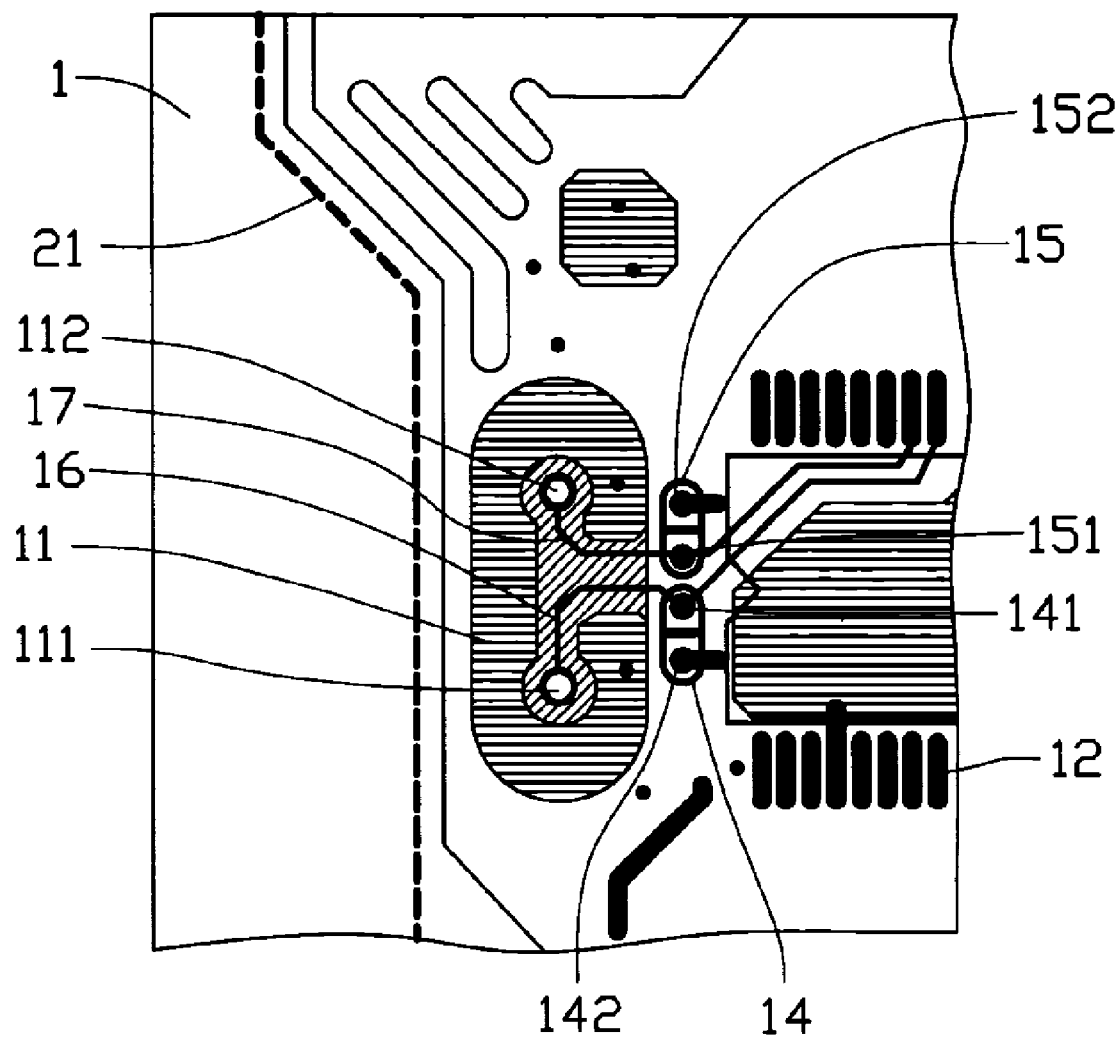
FIG. 4 a plane view of a signal layer of the PCB of FIG. 2, with a broken line indicating a cut-off line of a power layer of the PCB.

Referring also to FIG. 4, the upper one of the signal layers 1 includes a crystal oscillator pad 11, a clock generator pad 12, and two capacitor pads 14, 15. The capacitor pads 14 and 15 are soldered on the signal layer 1 and arranged between the crystal oscillator pad 11 and the clock generator pad 12. The crystal oscillator pad 11 defines two vias 111, 112 therein for connecting the crystal oscillator 20. The capacitor pad 14 includes two small pads 141, 142. The capacitor pad 15 also includes two small pads 151, 152. The clock generator pad 12 includes two rows of small pads. The vias 111 and 112 of the crystal oscillator pad 11 are connected to two small pads of the clock generator pad 12 by a signal line 16 and a signal line 17 respectively. The signal lines 16 and 17 are respectively connected to the small pad 141 of the capacitor pad 14 and the small pad 151 of the capacitor pad 15. The small pad 142 of the capacitor pad 14 and the small pad 152 of the capacitor pad 15 are grounded. The power layer 2 of the PCB is divided into two areas by a cut-off line 21. Each area is at a different voltage level. The cut-off line 21 is located at one side of the crystal oscillator pad 111 and the clock generator pad 12. The widths of the signal lines 16 and 17 are approximately ten mils.

Because the cut-off line 31 of the power layer 2 is not located under the crystal oscillator pad 11 and offset from the crystal oscillator pad 11 in a direction parallel to the crystal oscillator pad 11, and the widths of the signal lines 16 and 17 are greater, better frequency stability of the crystal oscillator 20 is achieved.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A printed circuit board (PCB) comprising:
    a signal layer comprising a crystal oscillator pad, a clock generator pad, and two capacitor pads, the crystal oscillator pad connected to the clock generator pad and the capacitor pads via two signal lines; and
    a power layer divided into two areas by a cut-off line, the two areas respectively having different voltage levels, the cut-off line located at one side of the crystal oscillator pad and the clock generator pad.

2. The PCB as claimed in claim 1, further comprising a ground layer and an additional signal layer, the power layer and the ground layer being located between the signal layer and the additional signal layer.

3. The PCB as claimed in claim 1, wherein a width of each of the signal lines is approximately 10 mils.

4. The PCB as claimed in claim 1, wherein the crystal oscillator pad defines two vias therein, the two signal lines are respectively connected to the two vias.

5. The PCB as claimed in claim 1, wherein each of the capacitor pads includes two small pads, each of the signal lines is connected to one small pad of the corresponding capacitor pad, another small pad of each of the capacitor pads is grounded.

6. A printed circuit board (PCB) comprising:
a signal layer comprising a crystal oscillator pad, and a clock generator pad soldered thereon;
a power layer located under the signal layer, the power layer divided into two areas by a cut-off line, the two area respectively having different voltage levels, the crystal oscillator pad and the clock generator pad located above a same one of the areas; and
a ground layer, the power layer and the ground layer located under the signal layer.

7. The PCB as claimed in claim 6, wherein the crystal oscillator pad is connected to the clock generator pad via two signal lines, and a width of each of the signal lines is approximately 10 mils.

8. The PCB as claimed in claim 6, wherein the signal layer further comprises two capacitor pads, the crystal oscillator pad connected to the clock generator pad and the capacitor pads via two signal lines.

9. The PCB as claimed in claim 8, wherein the crystal oscillator pad defines two vias for connecting a crystal oscillator, the two signal lines are respectively connected to the two vias.

10. The PCB as claimed in claim 8, wherein each of the capacitor pads includes two small pads, each of the signal lines is connected to one small pad of the corresponding capacitor pad, another small pad of each of the capacitor pads is grounded.

11. A printed circuit board (PCB) comprising:
a signal layer comprising a crystal oscillator pad defining two vias configured for connecting with a crystal oscillator, and a clock generator pad connected with the two vias of the crystal oscillator pad via two signal lines;
a power layer located under the signal layer, the power layer being divided by a cut-off line into two areas with different voltage levels, the cut-off line offsetting from the crystal oscillator pad in a direction parallel to the crystal oscillator pad; and
a ground layer located under the power layer.

12. The PCB as claimed in claim 11, wherein the signal layer further comprises two capacitor pads located between and connected to the crystal oscillator pad and the clock generator pad.

13. The PCB as claimed in claim 12, wherein each of the capacitor pads includes two small pads, each of the signal lines is connected to one small pad of a corresponding capacitor pad, the other small pad of each of the capacitor pads is grounded.

14. The PCB as claimed in claim 11, wherein a width of each of the signal lines is approximately 10 mils.

15. The PCB as claimed in claim 11, further comprising an additional signal layer located under the ground layer.

* * * * *